(12) United States Patent
Russell

(10) Patent No.: US 11,464,131 B2
(45) Date of Patent: Oct. 4, 2022

(54) CABLE MANAGEMENT ASSEMBLY

(71) Applicant: Seagate Technology LLC, Cupertino, CA (US)

(72) Inventor: Michael J. Russell, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/785,290

(22) Filed: Feb. 7, 2020

(65) Prior Publication Data
US 2021/0251100 A1 Aug. 12, 2021

(51) Int. Cl.
H05K 7/14 (2006.01)
H02G 11/00 (2006.01)

(52) U.S. Cl.
CPC .......... H05K 7/1491 (2013.01); H02G 11/00 (2013.01); H05K 7/1487 (2013.01); H05K 7/1489 (2013.01)

(58) Field of Classification Search
None
See application file for complete search history.

(56) References Cited

U.S. PATENT DOCUMENTS

| | | | | |
|---|---|---|---|---|
| 5,584,396 A * | 12/1996 | Schmitt | ........... | H02B 1/36 211/26 |
| 6,263,141 B1 * | 7/2001 | Smith | ........... | G02B 6/4455 385/135 |
| 6,538,879 B2 * | 3/2003 | Jiang | ........... | G06F 1/184 211/26 |
| 6,788,786 B1 * | 9/2004 | Kessler | ........... | H05K 5/0247 379/413.04 |
| 6,925,241 B2 * | 8/2005 | Bohle | ........... | G02B 6/4455 385/135 |
| 7,086,539 B2 * | 8/2006 | Knudsen | ........... | G02B 6/4452 211/26 |
| 7,189,924 B1 | 3/2007 | Popescu et al. | | |
| 8,231,014 B2 | 7/2012 | Chen et al. | | |
| 8,417,074 B2 * | 4/2013 | Nhep | ........... | G02B 6/3897 385/24 |
| 9,258,916 B2 * | 2/2016 | Lu | ........... | G02B 6/4455 |
| 9,335,786 B2 * | 5/2016 | Stewart | ........... | H05K 7/1492 |
| 9,668,372 B2 * | 5/2017 | Chen | ........... | H05K 7/1491 |
| 9,787,076 B2 * | 10/2017 | Li | ........... | H05K 7/02 |
| 9,936,601 B2 | 4/2018 | Amdahl | | |
| 9,949,400 B2 | 4/2018 | Yi | | |
| 10,025,055 B2 * | 7/2018 | Alexi | ........... | G02B 6/4452 |
| 10,133,302 B2 | 11/2018 | Yuan et al. | | |
| 10,175,440 B2 * | 1/2019 | Alexi | ........... | H04Q 1/131 |
| 10,209,471 B2 | 2/2019 | Campbell et al. | | |

(Continued)

*Primary Examiner* — Xanthia C Cunningham
(74) *Attorney, Agent, or Firm* — Faegre Drinker Biddle & Reath LLP

(57) ABSTRACT

A system includes a cable management assembly movable between an extended position and a retracted position. The cable management assembly includes a first pair of brackets slidable with respect to each other as the cable management assembly moves between the extended position and the retracted position. The cable management assembly also includes a second pair of brackets slidable with respect to each other as the cable management assembly moves between the extended position and the retracted position. One of the first pair of brackets is pivotably coupled to one of the second pair of brackets.

20 Claims, 8 Drawing Sheets

(56) References Cited

U.S. PATENT DOCUMENTS

| | | | |
|---|---|---|---|
| 10,299,401 B2 | 5/2019 | Chen et al. | |
| 10,522,612 B1* | 12/2019 | Liu | H05K 5/0247 |
| 10,645,837 B1* | 5/2020 | Tsorng | H05K 5/0226 |
| 11,134,582 B2* | 9/2021 | Chen | H05K 7/1491 |
| 2004/0190235 A1* | 9/2004 | Chou | G06F 1/184 |
| | | | 361/679.02 |
| 2006/0275008 A1* | 12/2006 | Xin | G02B 6/4455 |
| | | | 385/135 |
| 2008/0164789 A1* | 7/2008 | Williams | A47B 88/43 |
| | | | 312/223.1 |
| 2009/0078834 A1 | 3/2009 | Chen et al. | |
| 2009/0121093 A1* | 5/2009 | Murayama | H02G 11/00 |
| | | | 248/70 |
| 2010/0193646 A1* | 8/2010 | Chen | H02G 3/32 |
| | | | 248/70 |
| 2013/0050963 A1* | 2/2013 | Zhou | H05K 7/1491 |
| | | | 361/752 |
| 2013/0205579 A1* | 8/2013 | Mather | H05K 7/1491 |
| | | | 29/593 |
| 2014/0158646 A1* | 6/2014 | Chen | H05K 7/1421 |
| | | | 211/26 |
| 2014/0204497 A1* | 7/2014 | Martinez Sanchez | |
| | | | H05K 7/186 |
| | | | 361/119 |
| 2014/0369011 A1* | 12/2014 | Jiang | H05K 7/1432 |
| | | | 361/755 |
| 2014/0376870 A1 | 12/2014 | Takeuchi et al. | |
| 2015/0070830 A1* | 3/2015 | Iwasaki | G11B 33/142 |
| | | | 361/679.33 |
| 2015/0342081 A1* | 11/2015 | Chang | H05K 7/18 |
| | | | 361/679.02 |
| 2016/0309611 A1* | 10/2016 | Yi | H04Q 1/062 |
| 2019/0058317 A1* | 2/2019 | Chen | H05K 7/1491 |
| 2019/0319441 A1 | 10/2019 | Chen et al. | |
| 2020/0218023 A1* | 7/2020 | Chen | F16M 11/38 |

\* cited by examiner

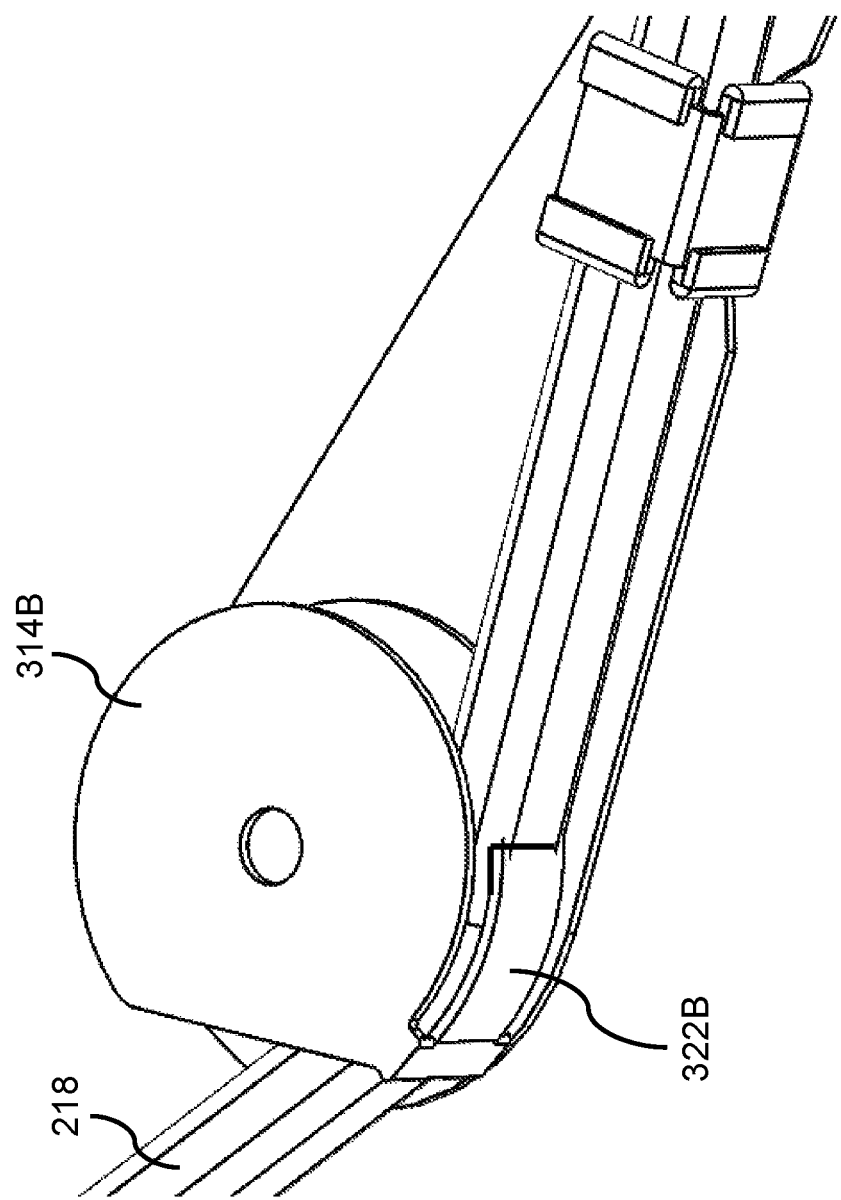

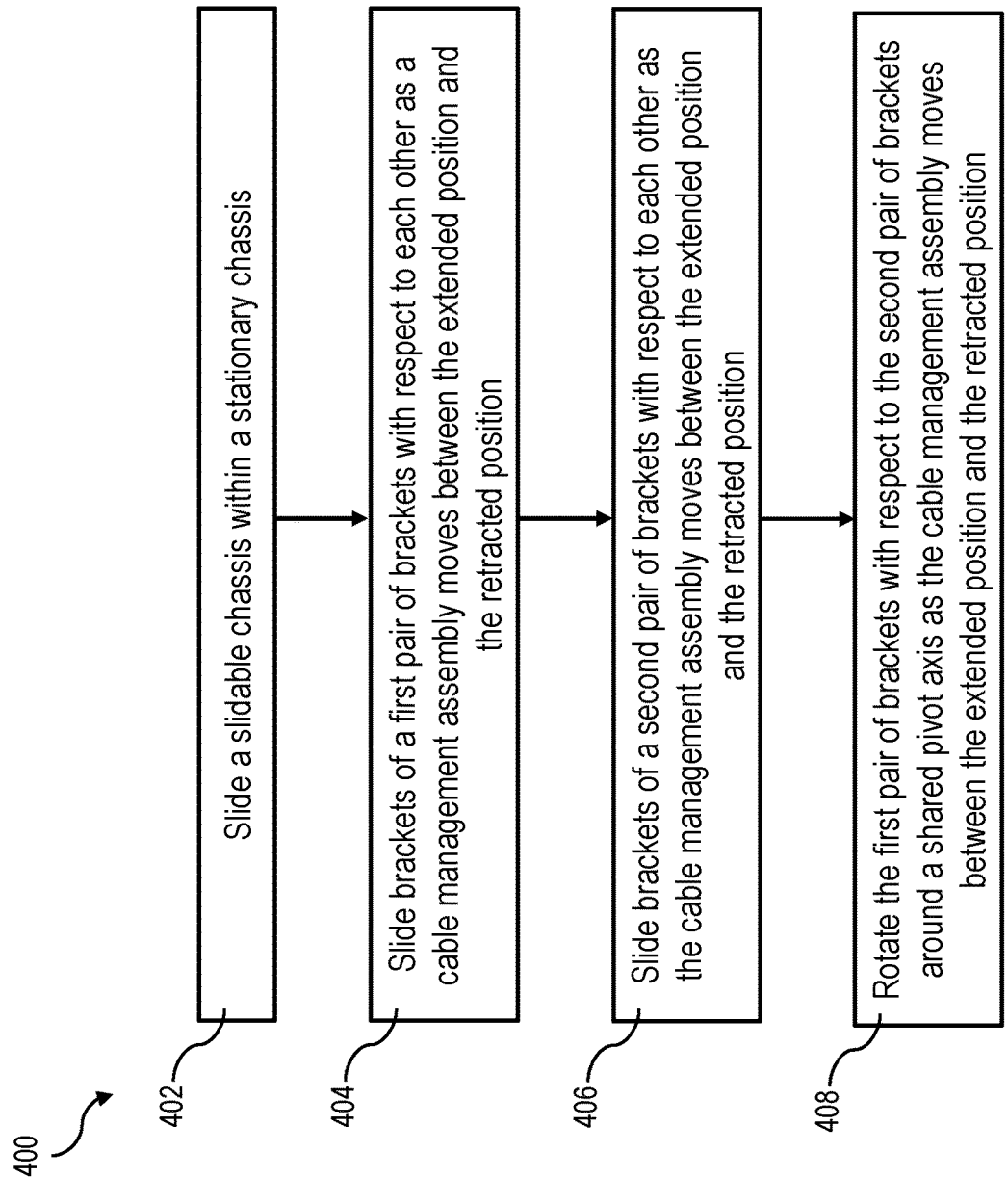

CABLE MANAGEMENT ASSEMBLY

SUMMARY

In certain embodiments, a system includes a cable management assembly movable between an extended position and a retracted position. The cable management assembly includes a first pair of brackets slidable with respect to each other as the cable management assembly moves between the extended position and the retracted position. The cable management assembly also includes a second pair of brackets slidable with respect to each other as the cable management assembly moves between the extended position and the retracted position. One of the first pair of brackets is pivotably coupled to one of the second pair of brackets.

In certain embodiments, a cable management assembly includes a first pair of brackets slidable with respect to each other as the cable management assembly moves between an extended position and a retracted position. The cable management assembly also includes a second pair of brackets slidable with respect to each other as the cable management assembly moves between the extended position and the retracted position. One of the first pair of brackets is pivotable coupled to one of the second pair of brackets.

In certain embodiments, a method of moving a cable management assembly between a retracted position and an extended position is disclosed. The method includes sliding a slidable chassis within a stationary chassis of a data storage enclosure, sliding brackets of a first pair of brackets with respect to each other as the cable management assembly moves between the extended position and the retracted position, sliding brackets of a second pair of brackets with respect to each other as the cable management assembly moves between the extended position and the retracted position, and rotating the first pair of brackets with respect to the second pair of brackets around a shared pivot axis as the cable management assembly moves between the extended position and the retracted position.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIGS. 6 and 7 show partial views of the cable management assembly FIGS. 4 and 5 in an extended position, in accordance with certain embodiments of the present disclosure.

FIG. 8 shows a block diagram of steps of a method, in accordance with certain embodiments of the present disclosure.

Figure 1:
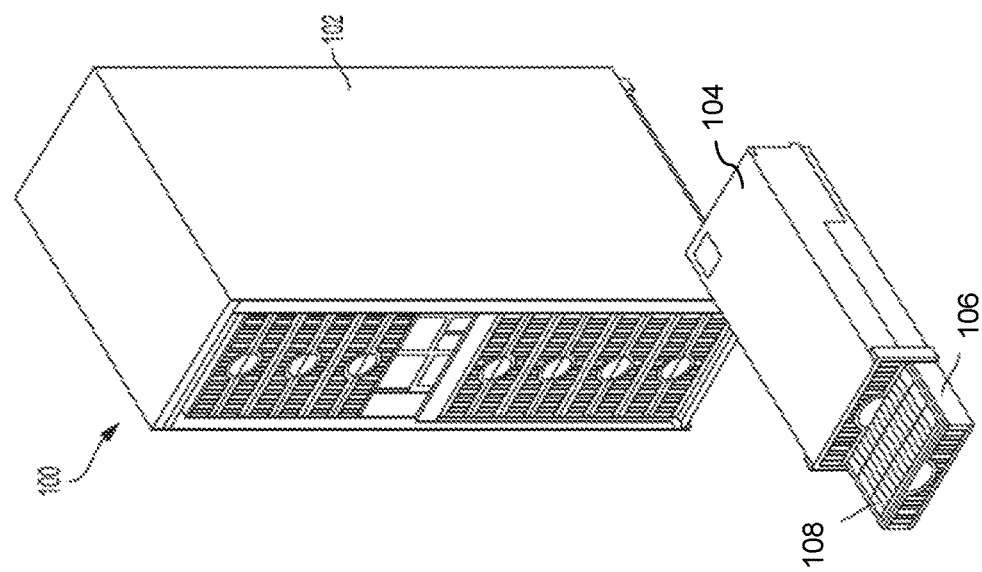
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems can utilize various drawers or enclosures in which individual data storage devices are positioned. The drawers or enclosures may be able to slide in and out of the data storage for maintenance. For example, the drawers and enclosures can be pulled at least partially out of the data storage system to remove and replace a data storage device. However, when the drawer or enclosure is pulled out from the enclosure to replace a data storage device, the rest of the data storage devices and other electronics of the drawer or enclosure need to continue operating. Certain embodiments of the present disclosure are accordingly directed to cable management assemblies that allow a drawer or enclosure to be extended and retracted while maintaining power to the data storage devices and other electronics within the drawer or enclosure.

FIG. 1 shows a data storage system 100 including a rack 102 (e.g., a cabinet) with a plurality of enclosures 104. Each enclosure 104 can include sub-enclosures or drawers 106. Each drawer 106 can be configured as a sliding enclosure such that the drawer 106 can extend horizontally away from the rack 102 to expose a set of data storage devices 108 installed within the drawer 106.

Figure 2:
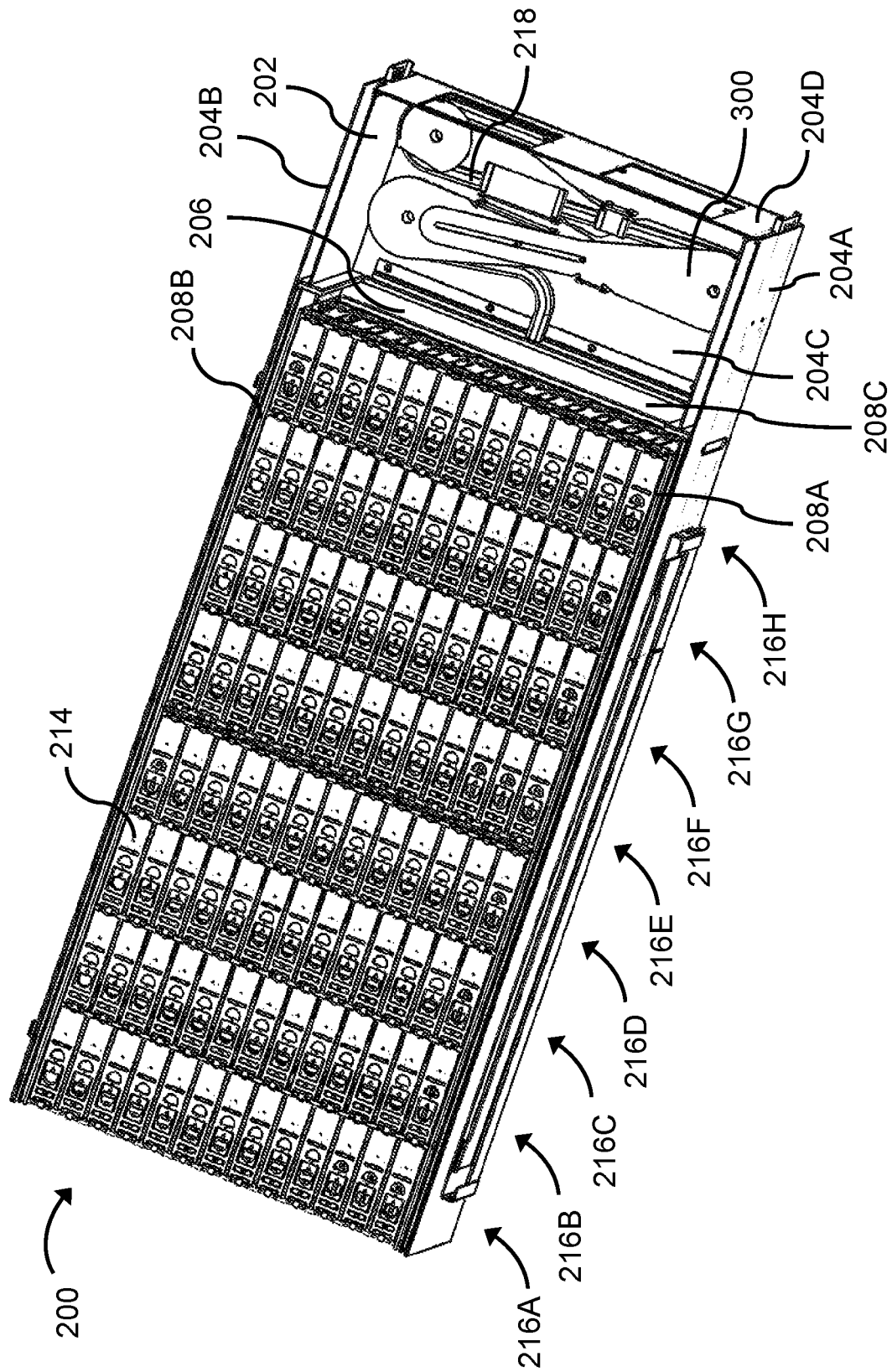
FIG. 2 shows a perspective view of an enclosure in a retracted position, in accordance with certain embodiments of the present disclosure.
Figure 3:
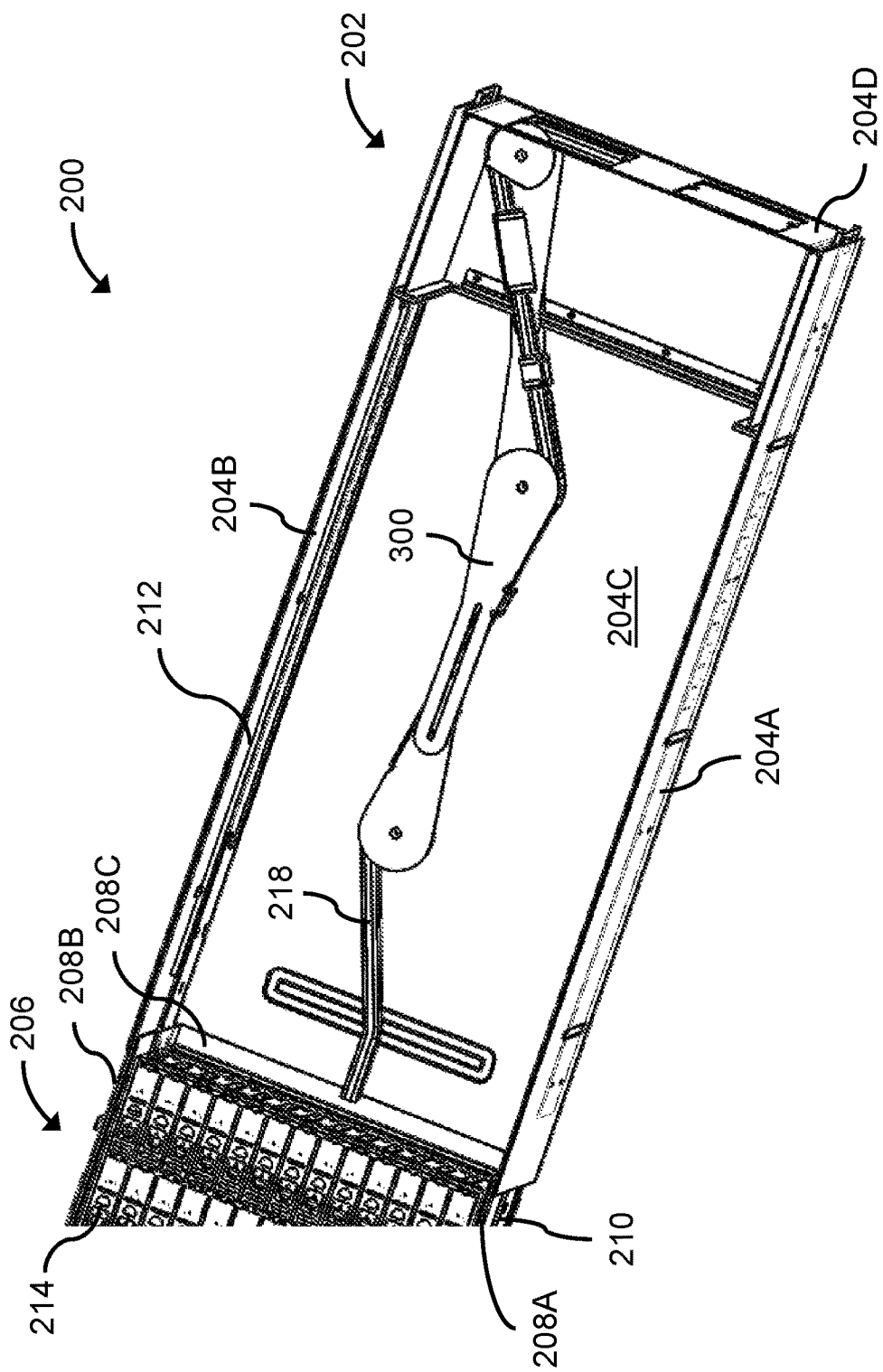
FIG. 3 shows a perspective view of the enclosure of FIG. 2 in an extended position, in accordance with certain embodiments of the present disclosure.

FIGS. 2 and 3 show an enclosure 200 with features (e.g., sub-enclosures or sliding chassis) that can slide into and out of the enclosure 200 in a drawer-like fashion between a retracted position and an extended position. FIG. 2 shows the enclosure 200 in the retracted position, and FIG. 3 shows the enclosure 200 in the extended position. The enclosure 200 can be utilized in a data storage system such as the data storage system 100 of FIG. 1. For example, the data storage system 100 could include multiples of the enclosure 200 shown in FIGS. 2 and 3 and described herein.

The enclosure 200 includes a stationary chassis 202 with a first side wall 204A, a second side wall 204B, a bottom wall 204C, and a back wall 204D. The enclosure 200 further includes a sliding chassis 206, which has a first side wall 208A, a second side wall 208B, and a bottom wall 208C. The sliding chassis 206 includes slides 210 (shown in FIG. 3) attached to the first side wall 208A and the second side wall 208B and that are slidably coupled to rails 212 (shown in FIG. 3) of the stationary chassis 202. As such, the sliding chassis 206 can be inserted into and retracted out of the stationary chassis 202. In certain embodiments, multiple sliding chassis 206 are slidably coupled to the stationary chassis 202. For example, the enclosure 200 may be 12-unit-sized (12U-sized) enclosure arranged to house three 4U-sized sliding chassis 206. In certain embodiments, the sliding chassis 206 may be referred to as a sub-enclosure of the enclosure 200 and/or a drawer of the enclosure 200.

The sliding chassis 206 supports data storage devices 214 (e.g., hard disc drives and/or solid state drives) and other electronics. FIG. 2 shows eight rows 216A-H of data storage devices 214. Each data storage device 214 can be removably coupled from the sliding chassis 206. In certain embodiments, each data storage device 214 is mechanically and electrically coupled to electrical connectors positioned between the data storage devices 214 and the bottom wall 208C of the sliding chassis 206. For example, electrical connectors may be coupled to a printed circuit board that is shared among the data storage devices 214 and that transfers data signals and power signals to the data storage devices 214. The enclosure 200 can include one or more cables 218 that extend between the sliding chassis 206 and the stationary chassis 202. The cables 218 can transfer power and electrical signals to the data storage devices 214 (e.g., via the printed circuit board and electrical connectors).

As shown in FIGS. 2 and 3, the enclosure 200 includes a cable management assembly 300 that is movable between a retracted position and extended position. The cable management assembly 300 helps guide how the cables 218 move as the sliding chassis 206 is extended from and retracted into the stationary chassis 202. As shown in FIG. 2, in the retracted position, the cable management assembly 300 fits into a space near the back end of the stationary chassis 202 between the sliding chassis 206 and the back wall 204D of the stationary chassis 202. In certain embodiments, the distance between the back of the stationary chassis 202 and the back wall 204D in the retracted position is one-quarter to one-third of the distance the sliding chassis 206 is able to extend between the retracted position and the extended position. Put another way, the sliding chassis 206 can slide from the retracted position to the extended position a distance that is three or four times the distance between the back of the stationary chassis 202 and the back wall 204D in the retracted position. As such, the cable management assembly 300 allows the cables 218 to expand from the retracted positioned to the extended position at a ratio of 3-to-1 or 4-to-1. This compact design of the cable management assembly 300 provides more space in the enclosure 200 for data storage devices 214 instead of cables 218. Further, having a compact cable management assembly 300 causes fewer impediments for air flowing within the enclosure 200.

Figure 4:
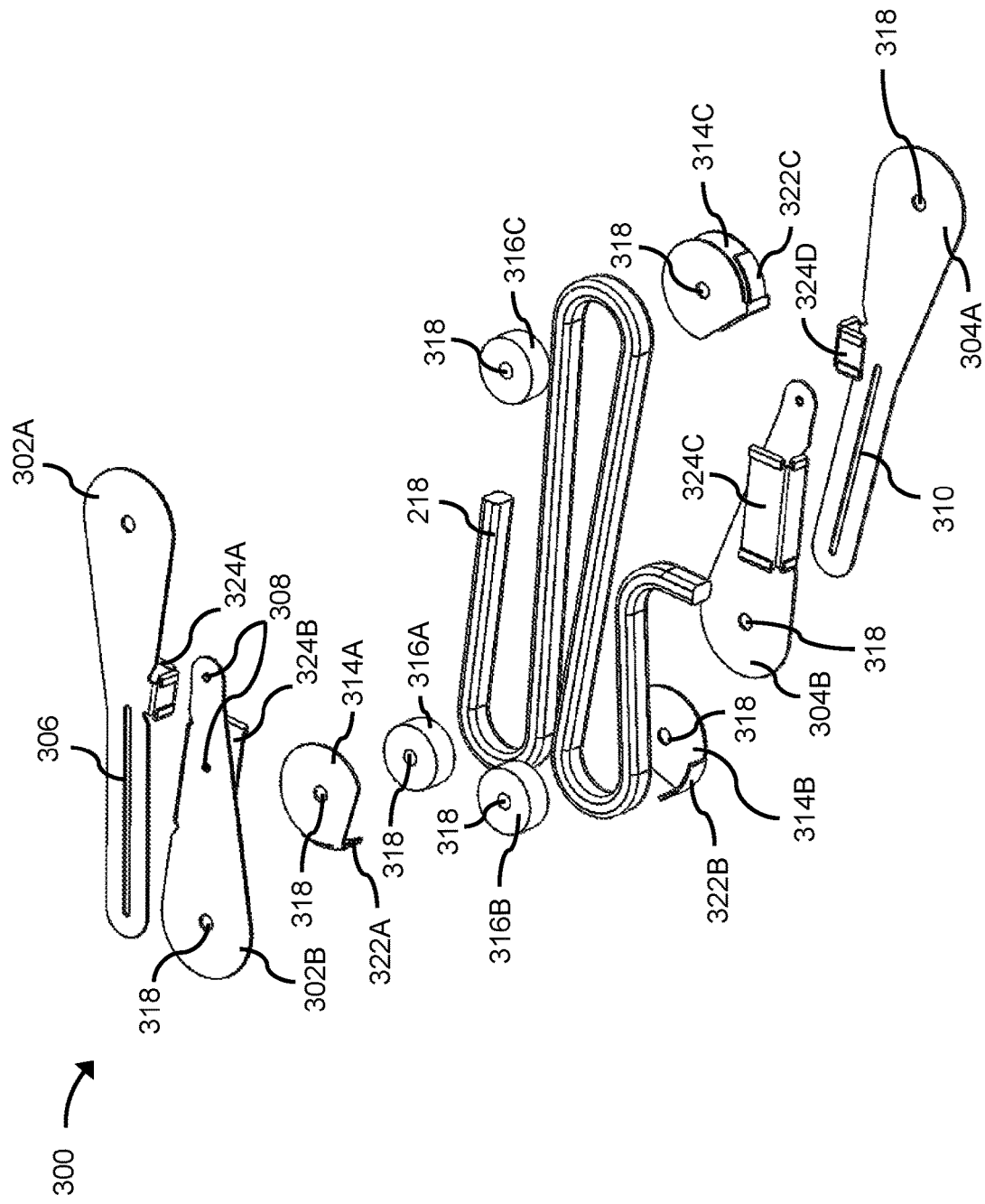
FIG. 4 shows an exploded view of a cable management assembly, in accordance with certain embodiments of the present disclosure.
Figure 5:
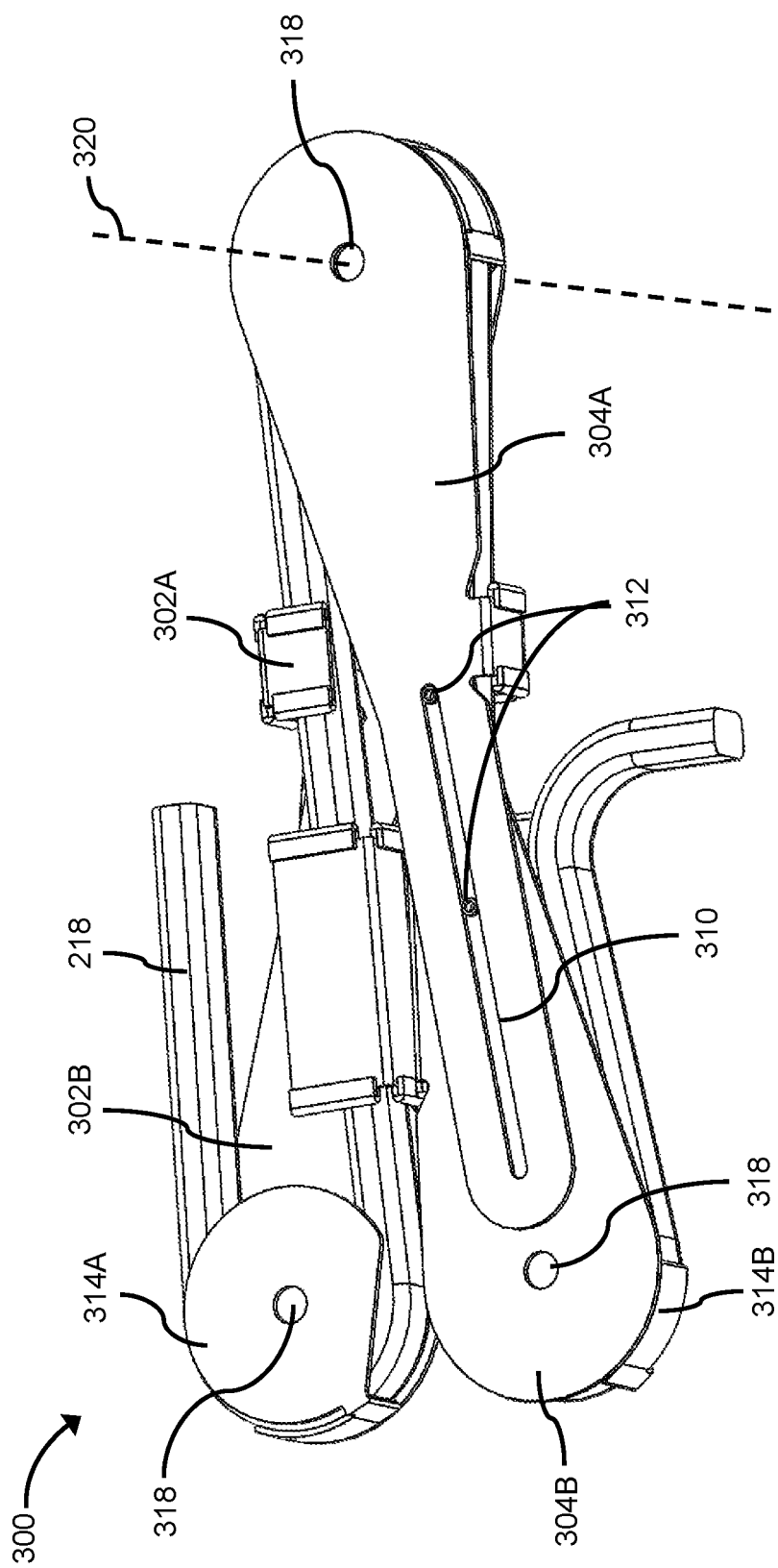
FIG. 5 shows a view of the cable management assembly FIG. 4 in a retracted position, in accordance with certain embodiments of the present disclosure.
Figure 6:
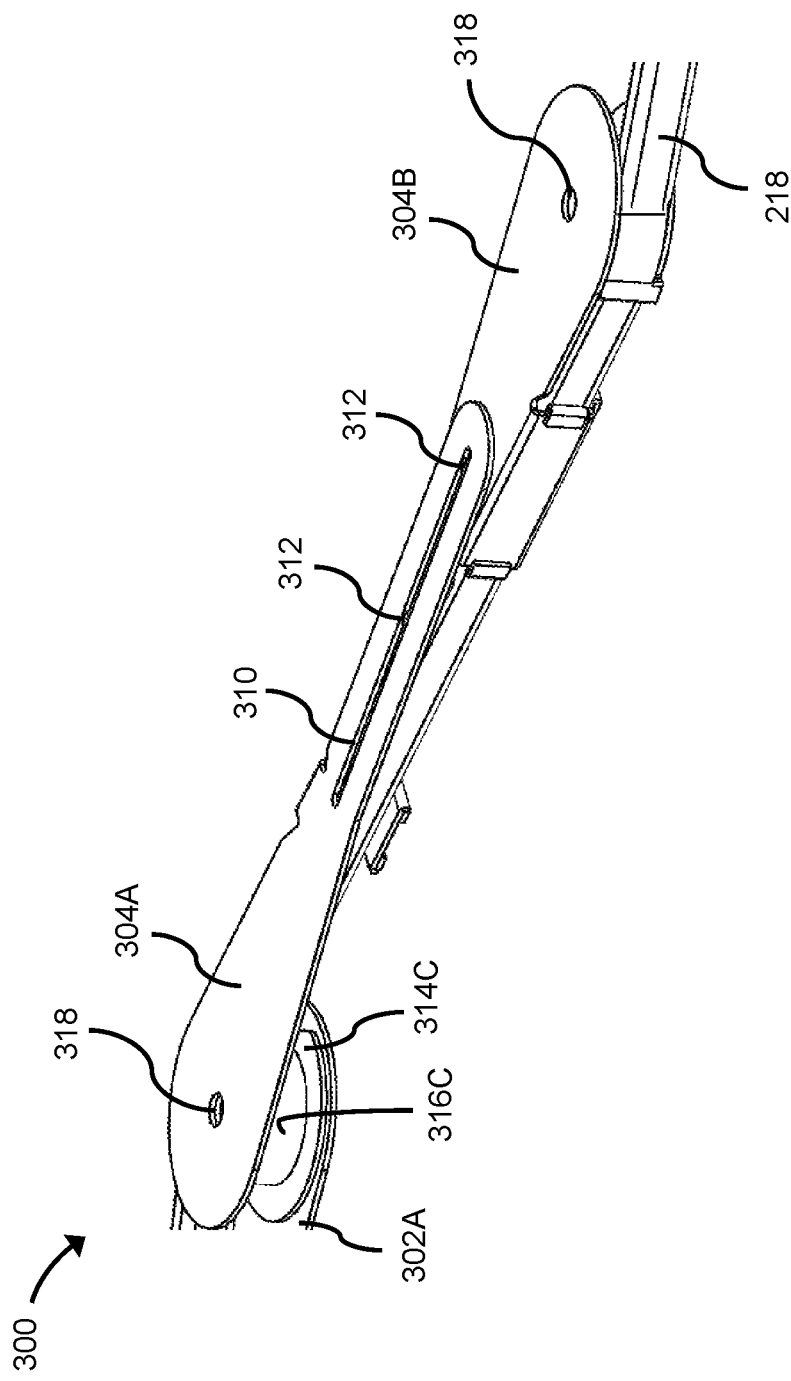

FIG. 4 shows an exploded view of the cable management assembly 300 and the cables 218. FIG. 5 shows the cable management assembly 300 in the retracted position and coupled to the cable 218, and FIG. 6 shows the cable management assembly 300 in the extended position and coupled to the cable 218.

The cable management assembly 300 is shown as including a first pair of brackets (i.e., a first bracket 302A and a second bracket 302B) and a second pair of brackets (i.e., a third bracket 304A and a fourth bracket 304B). The first bracket 302A includes a guide slot 306 (e.g., an elongated opening), and the second bracket 302B includes at least one guide 308 (e.g., a protrusion such as a pin) that extends from the second bracket 302B. When the first bracket 302A and the second bracket 302B are coupled together, the guide 308 at least partially extends through the guide slot 306. As such, when the cable management assembly 300 moves between the extended position and the retracted position, the first bracket 302A and the second bracket 302B slide with respect to each other. For example, the guide 308 is arranged to slide back and forth within the guide slot 306. The second bracket 302B can include multiple guides 308 that extend within the guide slot 306 to help prevent the first pair of brackets from rotating with respect to each other.

Similarly, the third bracket 304A is shown as including a guide slot 310, and the fourth bracket 304B includes at least one guide 312 (shown in FIGS. 5 and 6) that extends from the fourth bracket 304B. When the third bracket 304A and the fourth bracket 304B are coupled together, the guide 312 at least partially extends through the guide slot 310. As such, when the cable management assembly 300 moves between the extended position and the retracted position, the third bracket 304A and the fourth bracket 304B slide with respect to each other. The third bracket 304A can include multiple guides 312 that extend within the guide slot 310 to help prevent the second pair of brackets from rotating with respect to each other.

The sliding arrangements described above allow the cable management assembly 300 to be more compact (e.g., as measured end to end) in the retracted position and expand as the cable management assembly 300 moves from the retracted position to the extended position.

The cable management assembly 300 is also shown as including a plurality of hubs (i.e., a first hub 314A, a second hub 314B, and a third hub 314C) and a plurality of bushings (i.e., a first bushing 316A, a second bushing 316B, and a third bushing 316C).

When the cable management assembly 300 is assembled, the first hub 314A and the first bushing 316A are coupled to the second bracket 302B. For example, a fastener or pin-like structure can extend through each of the mounting holes 318 of the second bracket 302B, the first hub 314A, and the first bushing 316A. The first hub 314A can be coupled between the first bushing 316A and the second bracket 302B. When the cable 218 is at least partially wrapped around the first bushing 316A, the first hub 314A can help bias the cable 218 to contact the first bushing 316A.

Similarly, when the cable management assembly 300 is assembled, the second hub 314B and the second bushing 316B are coupled to the fourth bracket 304B. For example, a fastener or pin-like structure can extend through each of the mounting holes 318 of the fourth bracket 304B, the second hub 314B, and the second bushing 316B. The second hub 314B can be coupled between the second bushing 316B and the fourth bracket 304B. When the cables 218 are at least partially wrapped around the second bushing 316B, the second hub 314B can help bias the cables 218 to contact the second bushing 316B.

The third hub 314C and the third bushing 316C are coupled between the first bracket 302A and the third bracket 304A. For example, a fastener or pin-like structure can extend through each of the mounting holes 318 of the first bracket 302A, the third bracket 304A, the third hub 314C, and the third bushing 316C. With this arrangement, the first bracket 302A and the third bracket 304A are pivotably coupled to each other such that they are coupled together but can rotate independently with respect to each other around a pivot axis 320 (e.g., a common pivot axis). The third hub 314C can be coupled between the third bushing 316C and both the first bracket 302A and the third bracket 304A. For example, the third busing 316C may be at least partially positioned within the third hub 314C. When the cable 218 is at least partially wrapped around the third bushing 316C, the third hub 314C can help bias the cable 218 to contact the third bushing 316C.

As shown in FIG. 5, when the cable management assembly 300 is assembled and in the retracted position, the cables 218 bend at the first hub 314A, the second hub 314B, and the third hub 314C. For example, the cables 218 may bend around the first bushing 316A, the second bushing 316B, and the third bushing 316C. Cables can be damaged if bent at too small of a radii, and the particular minimum bending radii can depend on a given cable design (e.g., diameters, thicknesses, types of cables). As such, the bushings can be sized to maintain a minimum bend radii of the cables 218 at each of bushings.

In certain embodiments, the hubs 314A-C each include guide portions as shown in FIG. 4 (i.e., a first guide portion 322A, a second guide portion 322B, and a third guide portion 322C). The guide portions 322A-C (and other portions of the hubs 314A-C) can protect the cables 218 as the cable management assembly 300 extends and retracts.

In certain embodiments, each bracket includes one or more guide features to help maintain or urge the cables 218 in a particular way as the cable management assembly 300 moves between the retracted position and the extended position. For example, as shown in FIG. 4, the first bracket 302A can include a first guide structure 324A that is sized and shaped to allow the cables 218 to slide within the first guide structure 324A. Similarly, the second bracket 302B, the third bracket 304A, and the fourth bracket 304B can include respective guide structures (i.e., 324B-D) that are sized and shaped to allow the cables 218 to slide within the guide structures. In certain embodiments, the guide structures 324A-D are L-shaped, C-shaped, or U-shaped and provide some clearance between the guide structures 324A-D and the cables 218.

FIG. 7 shows a close-up view of the second hub 314B when the cable management assembly 300 is in the extended position. As shown, the second guide portion 322B helps maintain the position of the cables 218 between the second guide portion 322B and the second bushing 316B (shown in FIG. 4). In certain embodiments, the second guide portion 322B is a tab-like feature that can flex so that the cables 218 can move within the second hub 314B. In certain embodiments, the hubs 314A-C are comprised of plastic to permit the flexing and movement of the cables 218 without scratching or otherwise damaging the cables 218 as the cable management assembly 300 extends and retracts. As shown in FIG. 7, in the extended position, the cables 218 include a partial bend.

As noted above, the cable management assembly 300 can help guide the cables 218 as the sliding chassis 206 moves between the retracted position and the extended position. As the sliding chassis 206 moves from the retracted position to the extended position, the first pair of brackets (i.e., 302A and 302B) rotate or pivot with respect to the second pair of brackets (i.e., 304A and 304B). Further, the first bracket 302A and the second bracket 302B slide with respect to each other such that the distance from one end of the first bracket 302A to an opposing end of the second bracket 302B increases (e.g., the overall length of the first pair of brackets increases). Further, the third bracket 304A and the fourth bracket 304B slide with respect to each other such that the distance from one end of the third bracket 304A to an opposing end of the second fourth 304B increases (e.g., the overall length of the second pair of brackets increases). As such, the overall length of the cable management assembly 300 increases as the sliding chassis 206 moves from the retracted position to the extended position. Further, with the hubs 314A-C and the bushings 316A-C, the cables 218 can maintain a minimum bending radii as the sliding chassis 206 moves between the retracted position to the extended position. Further, the cables 218 can continue to transfer power to the data storage devices 214 and electronics positioned on the sliding chassis 206 and transfer data to and from the data storage devices 214 while the sliding chassis 206 is moved between the retracted position and the extended position.

As mentioned above, the enclosure 200 can include multiple sliding chassis 206 or drawers. Each sliding chassis 206 or drawer can include its own cable management assembly 300. As such, the enclosure 200 may include multiple cable management assemblies 300.

FIG. 8 shows a block diagram of a method 400 for using the cable management assembly 300 described above. The method 400 includes sliding the slidable chassis 206 within the stationary chassis 202 (block 402 in FIG. 8). The method 400 also includes sliding brackets 302A and 302B of a first pair of brackets with respect to each other as the cable management assembly 300 moves between the extended position and the retracted position (block 404 in FIG. 8). The method 400 further includes sliding brackets 304A and 304B of a second pair of brackets with respect to each other as the cable management assembly 300 moves between the extended position and the retracted position (block 406 in FIG. 8). The method 400 further includes rotating the first pair of brackets with respect to the second pair of brackets around a shared pivot axis as the cable management assembly 300 moves between the extended position and the retracted position (block 408 in FIG. 8).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A system comprising:
a cable; and
a cable management assembly movable between an extended position and a retracted position, the cable management assembly including:
a first pair of brackets slidable linearly with respect to each other but not rotatably movable with respect to each other as the cable management assembly moves between the extended position and the retracted position, a first bracket of the first pair of brackets includes a first guide slot, a second bracket of the first pair of brackets includes a first guide at least partially extending within the first guide slot and arranged to slide within the first guide slot as the cable management assembly moves between the extended position and the retracted position, and
a second pair of brackets slidable linearly with respect to each other but not rotatably movable with respect to each other as the cable management assembly moves between the extended position and the retracted position, wherein one of the first pair of brackets is pivotably coupled to one of the second pair of brackets about a rotation axis,
wherein the cable is at least partially wrapped around the rotation axis.

2. The system of claim 1, wherein the guide is a pin.

3. The system of claim 1, wherein the second bracket of the first pair of brackets includes multiple guides at least partially extending within the first guide slot.

4. The system of claim 1, wherein a third bracket of the second pair of brackets includes a second guide slot, wherein a fourth bracket of the second pair of brackets includes a second guide at least partially extending within the second guide slot and arranged to slide within the second guide slot as the cable management assembly moves between the extended position and the retracted position.

5. The system of claim 1, wherein the cable management assembly includes a plurality of hubs.

6. The system of claim 5, wherein the cable at least partially bends around the plurality of hubs.

7. The system of claim 1, further comprising:
a stationary chassis;
a slidable chassis that is configured to extend and retract within the stationary chassis; and
data storage devices positioned on the slidable chassis;
the cable is coupled between the stationary chassis and the slidable chassis.

8. The system of claim 7, wherein the cable management assembly guides the cable to bend when the slidable chassis is retracted and guides the cable to at least partially unbend when the slidable chassis is extended.

9. The system of claim 7, wherein the cable management system is arranged in the retracted position to fit within a first distance between the stationary chassis and the slidable chassis.

10. The system of claim 9, wherein the slidable chassis is arranged to slide within the stationary chassis a second distance that is at least three times the first distance.

11. The system of claim 9, wherein the slidable chassis is arranged to slide within the stationary chassis a second distance that is at least three to four times the first distance.

12. The system of claim 1, further comprising:
a stationary chassis;
a first slidable chassis that is configured to extend and retract within the stationary chassis;
the cable is coupled between the stationary chassis and the first slidable chassis, wherein the cable management assembly is coupled to the cable;
a second slidable chassis that is configured to extend and retract within the stationary chassis; and
a second cable coupled between the stationary chassis and the second slidable chassis, wherein a second cable management assembly is coupled to the second cable.

13. The system of claim 1, wherein the cable management assembly has a first overall length in the retracted position and a second overall length in the extended position that is greater than the first overall length.

14. A cable management assembly comprising:
a first pair of brackets slidable with respect to each other as the cable management assembly moves between an extended position and a retracted position;
a second pair of brackets slidable with respect to each other as the cable management assembly moves between the extended position and the retracted position, wherein one of the first pair of brackets is pivotable coupled to one of the second pair of brackets to rotate around a rotation axis; and
a hub arranged and shaped to bias a cable to at least partially wrap around the rotation axis.

15. The cable management assembly of claim 14, wherein the cable management assembly has a first overall length in the retracted position and a second overall length in the extended position that is greater than the first overall length.

16. The cable management assembly of claim 14, wherein a first bracket of the first pair of brackets includes a first guide slot, wherein a second bracket of the first pair of brackets includes a first guide at least partially extending within the first guide slot and arranged to slide within the first guide slot as the cable management assembly moves between the extended position and the retracted position.

17. The cable management assembly of claim 16, wherein a third bracket of the second pair of brackets includes a second guide slot, wherein a fourth bracket of the second pair of brackets includes a second guide at least partially extending within the second guide slot and arranged to slide within the second guide slot as the cable management assembly moves between the extended position and the retracted position.

18. The cable management assembly of claim 16, wherein the second bracket of the first pair of brackets includes multiple guides at least partially extending within the first guide slot.

19. The cable management system of claim 14, further comprising the cable at least partially wrapped around the rotation axis and biased by the hub.

20. A system comprising:
a cable; and
a cable management assembly movable between an extended position and a retracted position, the cable management assembly including:
a first pair of brackets slidable linearly with respect to each other but not rotatably movable with respect to each other as the cable management assembly moves between the extended position and the retracted position,
a second pair of brackets slidable linearly with respect to each other but not rotatably movable with respect to each other as the cable management assembly moves between the extended position and the retracted position, wherein one of the first pair of brackets is pivotably coupled to one of the second pair of brackets around a rotation axis, and
a bushing positioned to intersect with the rotation axis, wherein the cable is at least partially wrapped around the bushing,
wherein the cable management assembly is arranged in the retracted position to fit within a first distance between a stationary chassis and a slidable chassis, the slidable chassis configured to extend and retract within the stationary chassis, wherein the slidable chassis is arranged to slide within the stationary chassis a second distance that is three to four times the first distance.

* * * * *

UNITED STATES PATENT AND TRADEMARK OFFICE
CERTIFICATE OF CORRECTION

PATENT NO. : 11,464,131 B2
APPLICATION NO. : 16/785290
DATED : October 4, 2022
INVENTOR(S) : Michael J. Russell It is certified that error appears in the above-identified patent and that said Letters Patent is hereby corrected as shown below:

In the Claims

Claim 14
Line 2, "a first pair of brackets slidable with respect" should read -- a first pair of brackets slidable linearly with respect --
Lines 2-3, "to each other as the cable management" should read -- to each other but not rotatably movable with respect to each other as the cable management --
Line 5, "a second pair of brackets slidable with respect" should read -- a second pair of brackets slidable linearly with respect --
Lines 5-6, "to each other as the cable management" should read -- to each other but not rotatably movable with respect to each other as the cable management --

Signed and Sealed this
Twenty-eighth Day of February, 2023

Katherine Kelly Vidal
*Director of the United States Patent and Trademark Office*